United States Patent
Ikuta et al.

(10) Patent No.: US 8,633,556 B2
(45) Date of Patent: Jan. 21, 2014

(54) SOLID-STATE IMAGING DEVICE AND METHOD FOR MAKING THE SAME, AND MANUFACTURING SUBSTRATE FOR SOLID-STATE IMAGING DEVICE

(75) Inventors: Tetsuya Ikuta, Kanagawa (JP); Yuki Miyanami, Kanagawa (JP)

(73) Assignee: Sony Corporation, Tokyo (JP)

( * ) Notice: Subject to any disclaimer, the term of this patent is extended or adjusted under 35 U.S.C. 154(b) by 54 days.

(21) Appl. No.: 13/355,171

(22) Filed: Jan. 20, 2012

(65) Prior Publication Data
US 2012/0119316 A1     May 17, 2012

Related U.S. Application Data

(62) Division of application No. 12/550,553, filed on Aug. 31, 2009, now Pat. No. 8,124,440.

(30) Foreign Application Priority Data

Sep. 10, 2008  (JP) ................................. 2008-231779
Jul. 10, 2009  (JP) ................................. 2009-163729

(51) Int. Cl.
  *H01L 31/0232*  (2006.01)
  *H01L 31/0312*  (2006.01)
  *H01L 31/032*   (2006.01)
  *H01L 31/103*   (2006.01)

(52) U.S. Cl.
  USPC ............ 257/432; 257/E31.129; 257/E31.057; 257/E31.027; 257/E31.024

(58) Field of Classification Search
  None
  See application file for complete search history.

(56) References Cited

U.S. PATENT DOCUMENTS

| | | |
|---|---|---|
| 4,962,051 A | 10/1990 | Liaw |
| 5,882,987 A | 3/1999 | Srikrishnan |
| 2006/0186560 A1 | 8/2006 | Swain et al. |
| 2007/0111463 A1 | 5/2007 | Adam et al. |

(Continued)

FOREIGN PATENT DOCUMENTS

| | | |
|---|---|---|
| JP | 08-241977 A | 9/1996 |
| JP | 2005-142221 A | 6/2005 |

(Continued)

OTHER PUBLICATIONS

Huang, Zhihong, Jungwoo Oh, and Joe C. Campbell. "Back-side-illuminated High-speed Ge Photodetector Fabricated on Si Substrate Using Thin SiGe Buffer Layers." Applied Physics Letters 85.15 (2004): 3286.*

(Continued)

*Primary Examiner* — Thomas L Dickey
*Assistant Examiner* — Joseph Schoenholtz
(74) *Attorney, Agent, or Firm* — Rader, Fishman & Grauer PLLC

(57) ABSTRACT

A method for making a solid-state imaging device includes forming a pinning layer, which is a P-type semiconductor layer or an N-type semiconductor layer, on a first substrate by deposition; forming a semiconductor layer on the pinning layer; forming a photoelectric conversion unit in the semiconductor layer, the photoelectric conversion unit being configured to convert incident light into an electrical signal; forming, on the semiconductor layer, a transistor of a pixel unit and a transistor of a peripheral circuit unit disposed in the periphery of the pixel unit, and then forming a wiring section on the semiconductor layer; bonding a second substrate on the wiring section; and removing the first substrate after the second substrate is bonded.

12 Claims, 8 Drawing Sheets

(56) References Cited

U.S. PATENT DOCUMENTS

| | | |
|---|---|---|
| 2008/0061390 A1 | 3/2008 | Swain et al. |
| 2008/0135963 A1 | 6/2008 | Akiyama |
| 2008/0170149 A1* | 7/2008 | Iida et al. ............... 348/315 |
| 2008/0197436 A1 | 8/2008 | Uya |
| 2010/0182471 A1 | 7/2010 | Toda |

FOREIGN PATENT DOCUMENTS

| | | |
|---|---|---|
| JP | 2005-150521 A | 6/2005 |
| JP | 2006-019360 A | 1/2006 |
| JP | 2006-245088 A | 9/2006 |

OTHER PUBLICATIONS

Taraschi, G., "Strained Si, SiGe, and Ge On-insulator: Review of Wafer Bonding Fabrication Techniques." Solid-State Electronics 48.8 (2004): 1297-305.

Fischer, A.H. Kuhne, et al., "Strain and Surface Phenomena in SiGe Structures." Physical Review B 54.12 (1996): 8761-768.

Japanese Office Action issued Sep. 17, 2013 for corresponding Japanese Application No. 2009-163729.

* cited by examiner

SOLID-STATE IMAGING DEVICE AND METHOD FOR MAKING THE SAME, AND MANUFACTURING SUBSTRATE FOR SOLID-STATE IMAGING DEVICE

CROSS REFERENCES TO RELATED APPLICATIONS

This is a Divisional Application of U.S. patent application Ser. No. 12/550,553, filed Aug. 31, 2009, which in turn claims priority from Japanese Application Nos.: 2008-231779, filed Sep. 10, 2008 and 2009-163729, filed Jul. 10, 2009. The entire contents of which are incorporated herein by reference.

BACKGROUND OF THE INVENTION

1. Field of the Invention

The present invention relates to a solid-state imaging device and a method for making the device, and a manufacturing substrate for a solid-state imaging device.

2. Description of the Related Art

Currently available solid-state imaging devices are usually complementary metal oxide semiconductor (CMOS) sensors of a front-illuminated type in which wiring layers are formed at the incident-light-side of photodiodes and incident light enters the photodiodes through the wiring layers. However, as miniaturization proceeds, the wiring pitch becomes narrower and the number of stacked layers increases, thereby increasing the thickness of wiring layers. As a result, the distance between a condenser lens that guides incident light to a photodiode and the photodiode increases, and obliquely incident light has difficulty reaching the photodiode.

A back-illuminated-type solid-state imaging element is an example of a solid-state imaging device that has addressed this problem (e.g., refer to Japanese Unexamined Patent Application Publication No. 2005-142221). A back-illuminated type solid-state imaging element has an effective aperture ratio of 100% for obliquely incident light and exhibits improved sensitivity.

As shown in FIG. 9A, a silicon-on-insulator (SOI) substrate 110 including an insulating layer (BOX layer) 112 and an active layer 113 on the insulating layer 112 is used in a back-illuminated solid-state imaging device. Then, as shown in FIG. 9B, a pinning layer 114 for suppressing dark current is formed in a lower portion of the active layer 113, i.e., a SOI layer, by ion implantation. As shown in FIG. 9C, photodiodes 121 are formed in the active layer 113. Although not shown in the drawing, transistors for pixel units, transistors for peripheral circuits, and other associated components are formed. Then wirings (not shown) and interlayer insulating films (not shown) are layered to form a wiring section 131. Subsequently, as shown in FIG. 9D, a support substrate 140 is bonded on the wiring section 131. As shown in FIG. 9E, the SOI substrate 110 is flipped, and a substrate portion 111 of the SOI substrate 110 is ground to expose the insulating layer 112, as shown in FIG. 9F. The end point of the back-surface grinding is detected by this insulating layer 112.

Next, as shown in FIG. 10A, the insulating layer 112 (refer to FIG. 9F) is removed to expose the active layer 113 in which the pinning layer 114 is formed. Then as shown in FIG. 10B, a color filter layer 151 is formed on the active layer 113 and condenser lenses 153 are formed on the color filter layer 151.

However, in forming the pinning layer 114 for suppressing dark current in the lower portion of the active layer 113 by ion implantation, the depth-direction distribution of the dopant concentration can rarely be made steep and thus suppression of the dark current has not been sufficient.

SUMMARY OF THE INVENTION

The issue to be addressed is that dark current is not sufficiently suppressed since it is difficult to make the impurity concentration distribution of the pinning layer steep in the depth direction.

It is desirable to sufficiently suppress dark current by making the impurity concentration distribution of the pinning layer in the depth direction steep.

A method for making a solid-state imaging device according to one embodiment includes forming a pinning layer, which is a P-type semiconductor layer or an N-type semiconductor layer, on a first substrate by deposition; forming a semiconductor layer on the pinning layer; forming a photoelectric conversion unit in the semiconductor layer, the photoelectric conversion unit being configured to convert incident light into an electrical signal; forming, on the semiconductor layer, a transistor of a pixel unit and a transistor of a peripheral circuit unit disposed in the periphery of the pixel unit, and then forming a wiring section on the semiconductor layer; bonding a second substrate on the wiring section; and removing the first substrate after the second substrate is bonded.

According to this method for forming the solid-state imaging device, the P- or N-type semiconductor layer formed by deposition is used as the pinning layer. Thus, the impurity concentration distribution of the pinning layer in the depth direction has a steep concentration gradient. In addition, since a less-expensive bulk silicon substrate can be used as the first substrate, low-cost production is possible.

A solid-state imaging device of another embodiment includes a support substrate, a wiring section disposed on the support substrate, a semiconductor layer that includes a pixel unit having a photoelectric conversion unit configured to convert incident light into an electric signal and a peripheral circuit unit formed in a periphery of the pixel unit, the semiconductor layer being disposed on the wiring section, and a pinning layer which is a P- or N-type semiconductor layer formed on the semiconductor layer by deposition.

In this solid-state imaging device, since the pinning layer is a P- or N-type semiconductor layer formed by deposition, the impurity concentration distribution of the pinning layer in the depth direction has a steep concentration gradient.

A manufacturing substrate for a solid-state imaging device according to yet another embodiment includes a substrate, a pinning layer which is a P- or N-type semiconductor layer formed on the substrate by deposition, and a semiconductor layer formed on the pinning layer.

In the manufacturing substrate for the solid-state imaging device, since the pinning layer is a P- or N-type semiconductor layer formed by deposition, the impurity concentration distribution of the pinning layer in the depth direction has a steep concentration gradient.

According to the method for making the solid-state imaging device mentioned above, dark current can be sufficiently suppressed since the pinning layer has a steep concentration gradient in the depth direction.

According to the solid-state imaging device mentioned above, dark current can be sufficiently suppressed since the pinning layer has a steep concentration gradient in the depth direction.

Since the manufacturing substrate for the solid-state imaging device mentioned above includes the pinning layer that has a steep concentration gradient in the depth direction, a solid-state imaging device formed by using the manufacturing substrate can sufficiently suppress dark current.

DESCRIPTION OF THE PREFERRED EMBODIMENTS

Preferred embodiments for implementing the invention will now be described.

1. First Embodiment 1.1. First Example of a Method for Making a Solid-State Imaging Device A first example of a method for making a solid-state imaging device according to a first embodiment will now be described with reference to cross-sectional views of FIGS. 1A to 1F and 2 showing production steps. The cross-sectional views shown in FIGS. 1A to 2 each schematically show a relevant part for the method for making a solid-state imaging device. The solid-state imaging device described here is a back-illuminated solid-state imaging device.

Figure 1A:
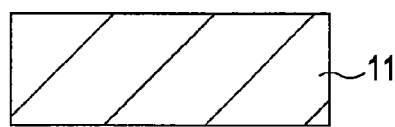
FIGS. 1A to 1F are cross-sectional views showing production steps of a first embodiment (first example of a method for making a solid-state imaging device)

As shown in FIG. 1A, a bulk silicon substrate is used as a first substrate 11, for example. Alternatively, an epitaxially grown substrate including a silicon substrate and epitaxially grown silicon layers thereon can be used naturally.

Figure 1B:
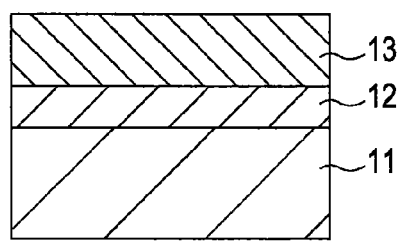

Next, as shown in FIG. 1B, a pinning layer 12, which is a P- or N-type semiconductor layer, is formed on the first substrate 11. The P- or N-type semiconductor layer is a semiconductor layer doped with a P-type impurity or an N-type impurity and is formed as an impurity-doped epitaxially grown layer formed by epitaxy, for example. The P- or N-type semiconductor layer epitaxially grown on the first substrate 11 is formed as a layer that has a thickness equal to or less than the critical thickness and lattice-matches the first substrate 11. The P- or N-type semiconductor layer having a thickness equal to or less than the critical thickness and lattice-matching the first substrate 11 is a P-type or N-type silicon layer. It is known that the critical thickness $h_c$ can be expressed by the Matthews-Blakeslee model, i.e., Equation (1) below:

$$h_c = \frac{a_e}{\sqrt{2}\pi f} \frac{1 - \frac{\gamma}{4}}{1+\gamma}\left(\ln\frac{h_c\sqrt{2}}{a_e} + 1\right) \quad (1)$$

In Equation (1), $h_c$ represents a critical thickness, $a_e$ represents a lattice constant of an epitaxially grown layer, $a_s$ represents a lattice constant of a substrate, f represents a maximum absolute value of lattice mismatch, i.e., $|(a_s-a_e)/a_e|$, and $\gamma$ represents a Poisson's ratio. If the thickness is equal to or less than the critical thickness, no defects occur and the dark current can be effectively suppressed.

A photodiode which forms a part of a photoelectric conversion unit described below has a P-type hole accumulation layer and an N-type signal charge accumulation layer in the depth direction joined to the P-type layer. When such a photoelectric conversion unit that uses electrons as carriers is to be formed, a P-type semiconductor layer doped with a P-type impurity is used as the pinning layer 12.

The photodiode which forms a part of the photoelectric conversion unit may be designed to use holes as carriers. According to this design, the conductivity type of the photoelectric conversion unit is reversed from that described above, and an N-type semiconductor layer doped with an N-type impurity is used as the pinning layer 12. The P-type impurity is, for example, boron, and the N-type impurity is, for example, phosphorus, arsenic, or antimony.

The impurity concentration in the pinning layer 12 is, for example, on the order of $10^{19}$ atoms/cm$^3$. For example, the impurity concentration is $3\times10^{19}$ atoms/cm$^3$. At such a concentration, diffusion of the impurity in the pinning layer 12 can be suppressed. Thus, the impurity concentration distribution near the pinning layer 12 interface remains steep. The pinning layer 12 is formed to have a thickness of, for example, 400 nm.

In order to form the pinning layer 12, an epitaxial chemical vapor deposition (CVD) system of a single wafer type or a batch type is used, for example. The chamber capacity is, for example, 5 to 20 L. An example of conditions for forming the pinning layer 12 by using a single-wafer epitaxial CVD system for 200 mm wafers will now be described.

First, an example in which an epitaxially grown silicon layer doped in situ with a P-type impurity, namely, boron, is formed as the pinning layer 12 is described. For example, dichlorosilane (DCS), diborane ($B_2H_6$ (diluted to 1% with hydrogen ($H_2$)), hydrogen chloride (HCl), and hydrogen ($H_2$) were used as the source gasses for epitaxial growth. The supply flow rate of dichlorosilane was 50 cm$^3$/min to 500 cm$^3$/min, for example. The supply flow rate of diborane was 5 cm$^3$/min to 200 cm$^3$/min, for example. The supply flow rate of hydrogen chloride was 15 cm$^3$/min to 200 cm$^3$/min, for example. The supply flow rate of hydrogen was 10 L/min to 30 L/min, for example. The pressure of the epitaxial growth atmosphere was set to, for example, 1.33 kPa, and the epitaxial growth temperature was set to, for example, 750° C.

Next, an example in which a semiconductor layer composed of silicon doped in situ with an N-type impurity, namely, phosphorus, is formed as the pinning layer 12 is described.

For example, dichlorosilane (DCS), phosphine (PH$_3$) (diluted to 1% with hydrogen (H$_2$)), and hydrogen (H$_2$) were used as the source gasses for epitaxial growth. The supply flow rate of dichlorosilane was 50 cm³/min to 500 cm³/min, for example. The supply flow rate of phosphine was 5 cm³/min to 200 cm³/min, for example. The supply flow rate of hydrogen was 10 L/min to 30 L/min, for example. The pressure of the epitaxial growth atmosphere was set to, for example, 101 kPa, and the epitaxial growth temperature was set to, for example, 750° C. to 800° C.

Next, an example in which a doped epitaxially grown silicon layer doped in situ with an N-type impurity, namely, arsenic, is formed as the pinning layer 12 is described.

For example, dichlorosilane (DCS), arsine ($AsH_3$) (diluted to 1% with hydrogen ($H_2$)), and hydrogen ($H_2$) were used as the source gasses for epitaxial growth. The supply flow rate of dichlorosilane was 50 cm³/min to 500 cm³/min, for example. The supply flow rate of arsine was 5 cm³/min to 200 cm³/min, for example. The supply flow rate of hydrogen was 10 L/min to 30 L/min, for example. The pressure of the epitaxial growth atmosphere was set to, for example, 101 kPa, and the epitaxial growth temperature was set to, for example, 650° C. to 750° C.

Alternatively, The P- or N-type semiconductor layer having a thickness equal to or less than the critical thickness and lattice-matching the first substrate 11 may be composed of P-type SiGeC or N-type SiGeC.

The P- or N-type semiconductor layer having a thickness equal to or less than the critical thickness and lattice-matching the first substrate 11 can be formed with a chalcopyrite compound semiconductor composed of a P-type CuGaInS mixed crystal or an N-type CuGaInS mixed crystal. A P-type CuAlGaInS mixed crystal, an N-type CuAlGaInS mixed crystal, a P-type CuAlGaInSSe mixed crystal, an N-type CuAlGaInSSe mixed crystal, and the like may also be used in the P- or N-type semiconductor layer described above.

For example, when the first substrate 11 is a silicon substrate, $CuGa_{0.52}In_{0.48}S_2$, $CuAl_{0.24}Ga_{0.23}In_{0.53}S_2$ $CuAl_{0.36}Ga_{0.64}S_{1.28}Se_{0.72}$, and the like lattice-match the first substrate 11.

When the first substrate 11 is a GaAs substrate, for example, $Ga_{0.52}In_{0.48}P$, $Al_{0.53}In_{0.47}P$, and the like lattice-match the first substrate 11, and may be used to form the P- or N-type semiconductor layer.

When the first substrate 11 is an InP substrate, for example, $Ga_{0.47}In_{0.53}As$, $Al_{0.47}In_{0.53}As$, and the like lattice-match the first substrate 11, and may be used to form the P- or N-type semiconductor layer.

The P- or N-type semiconductor layer epitaxially grown on the first substrate 11 may be a layer in which the lattice constant is gradually changed on the first substrate 11. The P- or N-type semiconductor layer having the lattice constant gradually changed on the first substrate 11 can be formed with P-type SiGeC or N-type SiGeC. The P-type impurity is, for example, boron, and the N-type impurity is, for example, phosphorus, arsenic, or antimony.

The P- or N-type semiconductor layer having the lattice constant gradually changed on the first substrate 11 may be formed with a chalcopyrite compound semiconductor composed of a P-type CuGaInS mixed crystal or an N-type CuGaInS mixed crystal.

For example, a silicon layer doped with one or both of germanium and carbon is used to form the pinning layer 12. When the pinning layer 12 contains one or both of germanium and carbon, the function of the pinning layer 12 as a stopper layer can be further enhanced in the step of removing the first substrate 11 described below.

For example, when the pinning layer 12 is doped with carbon (C), silicon carbide is formed and polishing or etching easily stops at the pinning layer 12 surface due to the presence of silicon carbide. The same occurs when the pinning layer 12 is doped with germanium. That is, silicon germanium is formed which causes polishing or etching to easily stop at the pinning layer 12 surface. In other words, the pinning layer 12 can be prevented from being polished or etched during the process of removing the first substrate 11 by polishing or etching.

Next, an example in which a semiconductor layer composed of silicon germanium doped in situ with a P-type impurity, namely, boron, is formed as the pinning layer 12 is described.

For example, dichlorosilane (DCS) gas, diborane ($B_2H_6$ (diluted to 1% with hydrogen ($H_2$)), germane ($GeH_4$), and hydrogen ($H_2$) were used as the source gasses for epitaxial growth.

The supply flow rate of dichlorosilane was 50 cm³/min to 500 cm³/min, for example. The supply flow rate of diborane was 5 cm³/min to 200 cm³/min, for example. The supply flow rate of germane was 5 cm³/min to 200 cm³/min, for example. The supply flow rate of hydrogen was 10 L/min to 30 L/min, for example. The pressure of the epitaxial growth atmosphere was set to, for example, 1.33 kPa, and the epitaxial growth temperature was set to, for example, 650° C. to 750° C.

Next, an example in which a semiconductor layer composed of silicon carbide doped in situ with a P-type impurity, namely, boron, is formed as the pinning layer 12 is described.

For example, dichlorosilane (DCS) gas, diborane ($B_2H_6$ (diluted to 1% with hydrogen ($H_2$)), monomethylsilane ($SiH_3CH$), and hydrogen ($H_2$) were used as the source gasses for epitaxial growth. The supply flow rate of dichlorosilane was 50 cm³/min to 500 cm³/min, for example. The supply flow rate of diborane was 5 cm³/min to 200 cm³/min, for example. The supply flow rate of monomethylsilane was 5 cm³/min to 200 cm³/min, for example. The supply flow rate of hydrogen was 10 L/min to 30 L/min, for example. The pressure of the epitaxial growth atmosphere was set to, for example, 1.33 kPa, and the epitaxial growth temperature was set to, for example, 650° C. to 750° C.

Next, a semiconductor layer 13 is formed on the pinning layer 12. The semiconductor layer 13 is a semiconductor layer formed by epitaxial growth. The semiconductor layer 13 is, for example, an epitaxially grown silicon layer.

An example of conditions for forming an epitaxially grown silicon layer as the semiconductor layer 13 by using a single-wafer epitaxial CVD system for 200 mm wafers will now be described.

For example, monosilane ($SiH_4$) and hydrogen ($H_2$) were used as the source gasses for epitaxial growth. The supply flow rate of monosilane was 50 cm³/min to 500 cm³/min, for example. The supply flow rate of hydrogen was 10 L/min to 30 L/min, for example. The pressure of the epitaxial growth atmosphere was set to, for example, 1.33 kPa, and the epitaxial growth temperature was set to, for example, 750° C.

In the example of forming the pinning layer 12 and the semiconductor layer 13, the following epitaxial CVD systems may be used instead of the single-wafer epitaxial CVD system for 200 mm wafers. Examples of the systems include a single-wafer epitaxial CVD system for 300 mm wafers, a batch-type epitaxial CVD system for 200 mm wafers, and a batch-type epitaxial CVD system for 300 mm wafers. In sum, an epitaxial CVD system can be used regardless of wafer diameter or whether it is a single-wafer-type or a batch-type. The epitaxial CVD system can form films by changing the process gas flow rates described above on the basis of the chamber capacity (e.g., in proportion to the chamber capacity).

The dopant concentration of the pinning layer 12 at the interface is preferably, for example, $1\times10^{16}$ atoms/cm$^3$ after the subsequent heating step. At such a concentration, charges produced by photoelectric conversion of blue wavelength light in particular can be effectively accumulated.

The semiconductor layer 13 may be a layer having a thickness equal to or less than the critical thickness and lattice-matching the pinning layer 12. For example, a SiGeC or CuGaInS mixed crystal, a CuAlGaInS mixed crystal, a CuAl-GaInSSe mixed crystal, and the like can be used. The semiconductor layer 13 may be a layer in which the lattice constant is gradually changed on the pinning layer 12. For example, a SiGeC or CuGaInS mixed crystal, a CuAlGaInS mixed crystal, a CuAlGaInSSe mixed crystal, and the like can be used.

The following processes are available for forming the P- or N-type semiconductor layer with a chalcopyrite compound semiconductor composed of a P- or N-type CuGaInS mixed crystal. Examples of the epitaxial growth processes include molecular beam epitaxy (MBE), metal organic chemical vapor deposition (MOCVD), and liquid phase epitaxy (LPE). Basically, any film-forming process may be employed.

For example, in a method that employs the MOCVD, the following organic metals are used as the source gasses. In one example, copper acetylacetone ($Cu(C_5H_7O_2)_2$) is used for Cu, trimethyl gallium ($Ga(CH_3)_3$) is used for Ga, trimethyl indium ($In(CH_3)_3$) is used for In, and dimethyl sulfide ($S(CH_3)_2$) is used for S. The substrate temperature is in the range of 400° C. to 1000° C. in which pyrolysis is possible.

According to the MBE, respective starting materials of Cu, Ga, In, and S are placed in a Knudsen cell and heated to an appropriate temperature so that the respective molecular beams irradiate the substrate and crystals are grown thereby. Some starting material may be a gas source, such as in the case of gas-source MBE. For example, hydrogen sulfide ($H_2S$) may be used as the sulfur starting material.

Figure 1C:
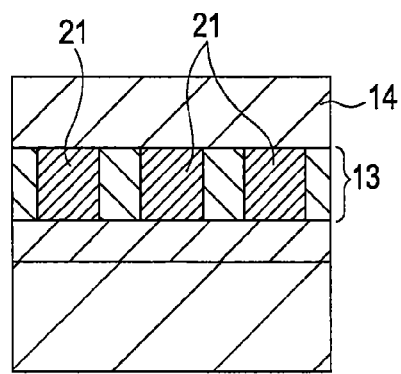

As shown in FIG. 1C, photoelectric conversion units 21 that convert incident light into an electric signal is formed in the semiconductor layer 13.

Although not shown in the drawing, transistors for pixel units in which the photoelectric conversion units 21 are formed, transistors for the peripheral circuit unit disposed in the periphery of the pixel units, and other associated components are also formed in the semiconductor layer 13.

A wiring section 14 is formed on the semiconductor layer 13. Although the details of the wiring section 14 are not illustrated, for example, wiring layers each including a plurality of wirings are stacked with interlayer insulation films therebetween and plugs in contact holes are used to connect the wirings between the wiring layers. The interlayer insulating films are composed of silicon oxide. The upper-most interlayer insulating film preferably has a flat surface.

Figure 1D:
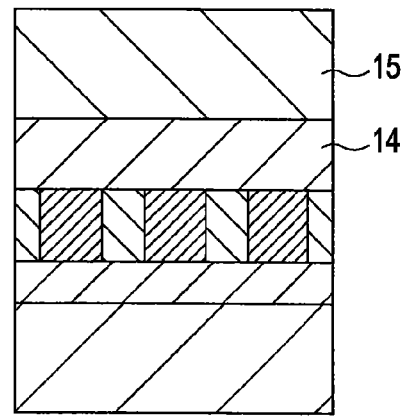

Next, as shown in FIG. 1D, a second substrate 15 is bonded on the wiring section 14. The upper-most surface of the wiring section 14 serves as the flat interlayer insulating film. The interlayer insulating film is, for example, a silicon oxide film. The silicon oxide film surface is bonded to the surface of the second substrate 15, which is a silicon substrate.

Figure 1E:
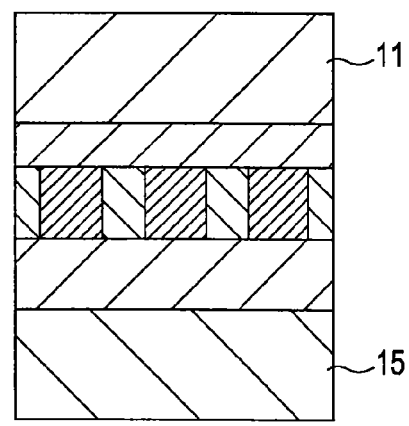

Then, as shown in FIG. 1E, the positions of the first substrate 11 and the second substrate 15 are flipped.

Figure 1F:
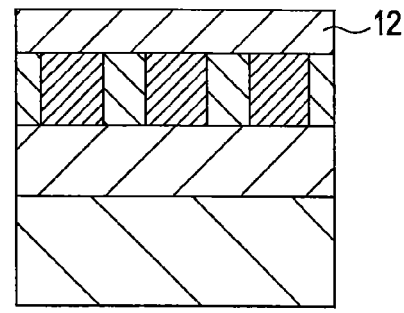

Next, as shown in FIG. 1F, the first substrate 11 (refer to FIG. 1E) is removed to expose the pinning layer 12. The first substrate 11 is removed by, for example, grinding. After most of the first substrate 11 is removed by grinding, the remaining the first substrate 11 is removed by polishing, etching, or both. When the first substrate 11 is removed by polishing or etching, a mirror surface is achieved. When the pinning layer 12 contains germanium or carbon, the function of the pinning layer 12 as a stopper layer can be further enhanced during the step of removing the first substrate 11. Thus, the pinning layer 12 can be used to detect the end point of the process of removing the first substrate 11.

Figure 2:
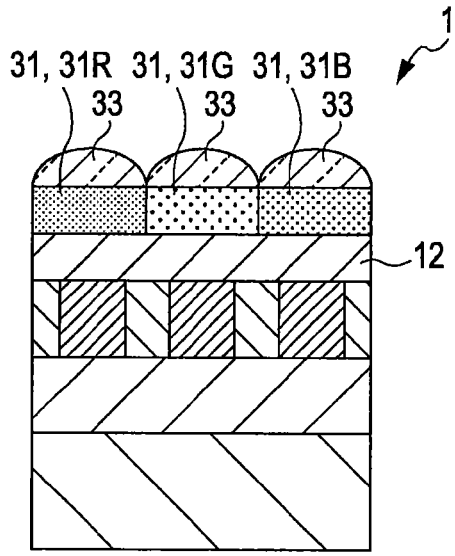
FIG. 2 is a cross-sectional view showing a production step of the first embodiment (first example of a method for making a solid-state imaging device)

Next, as shown in FIG. 2, color filter layers 31 (31R, 31G, and 31B) are formed on the pinning layer 12. In general, the color filter layers 31 of three colors, namely, red (R), green (G), and blue (B) are formed to obtain color images. Naturally, other color filter layers of complementary colors can be used.

Condenser lenses 33 that guide incident light into the photoelectric conversion units 21 are formed on the color filter layers 31.

This ends the fabrication of a back-illuminated solid-state imaging device 1.

Although epitaxial layers are used as the first substrate 11, the pinning layer 12, and the semiconductor layer 13, polycrystal layers or amorphous layers may be used instead.

According to the method for forming the solid-state imaging device described above, the P- or N-type semiconductor layer formed by deposition is used as the pinning layer 12. Thus, the impurity concentration distribution of the pinning layer 12 in the depth direction has a steep concentration gradient. Thus, the dark current can be sufficiently suppressed. Since a bulk silicon substrate less expensive than a SOI substrate is used as the first substrate 11, a low-cost solid-state imaging device 1 can be provided.

When the pinning layer is formed by ion implantation as has been done heretofore, the pinning layer becomes thick. However, according to the embodiment described above, since the pinning layer 12 is a P- or N-type semiconductor layer formed by deposition, the pinning layer can be made thin. Thus, the optical path of incident light from the condenser lens 33 to the photoelectric conversion unit 21 can be shortened. This improves the condensing property, and, since light absorption at the pinning layer 12 is suppressed, the sensitivity can also be improved.

Figure 3:
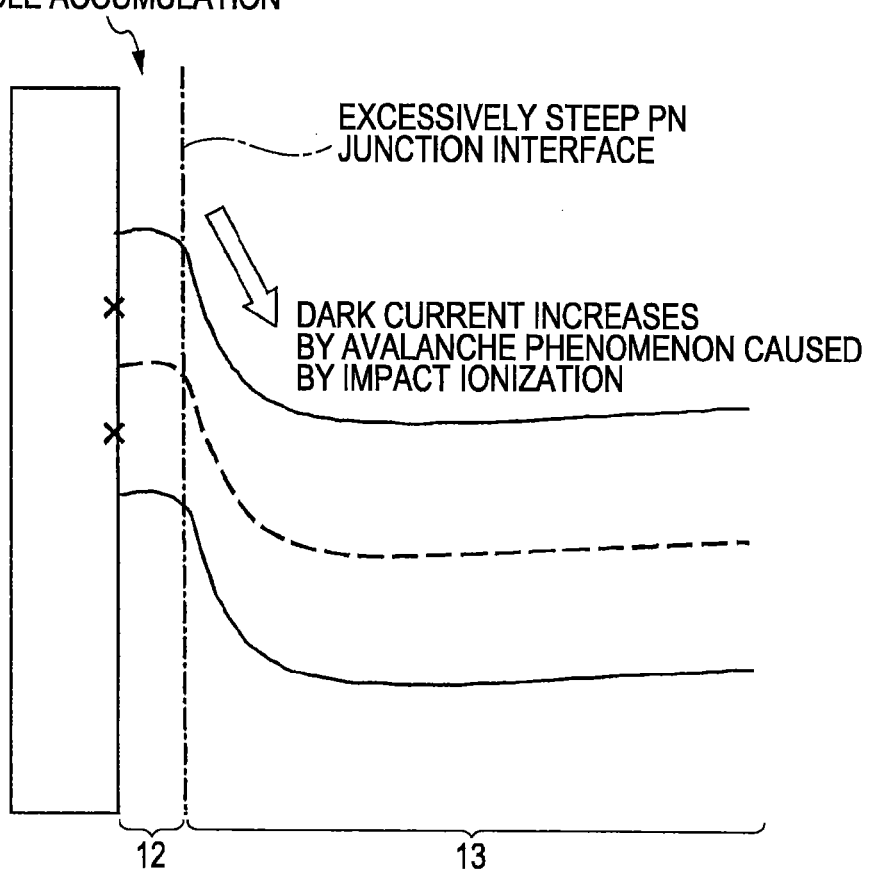
FIG. 3 is a diagram showing an avalanche phenomenon caused by impact ionization.

In the method described above, an epitaxially grown layer doped with boron (B) is used in forming the pinning layer 12. In such a case, the boron (B) concentration necessary for assuring sufficient selectivity for etching silicon (Si) with an alkaline etchant is about $1\times10^{19}$ atoms/cm$^3$. If the pinning layer 12 having such a boron concentration is used as is, as shown in FIG. 3, the concentration of the P/N interfacial electrical field between the pinning layer 12 and the semiconductor layer 13 having the photoelectric conversion units formed therein becomes excessively high due to the presence of boron (B) in high concentration. This may result in avalanche phenomena and thus an increase in dark current. While a boron (B) concentration adequate for the pinning layer 12 is $1\times10^{17}$ atoms/cm$^3$ to $1\times10^{18}$ atoms/cm$^3$, the etching selectivity for silicon is not sufficient at such a boron concentration. The production method that resolves such a discrepancy is described below.

1.2. Second Example of a Method for Making a Solid-State Imaging Device

A second example of a method for making a solid-state imaging device of the first embodiment will now be described with reference to cross-sectional views of FIGS. 4A to 4F showing the production steps. The cross-sectional views of FIGS. 4A to 4F each schematically show a relevant part for the method for making a solid-state imaging device. The solid-state imaging device described here is a back-illuminated solid-state imaging device.

Figure 4A:
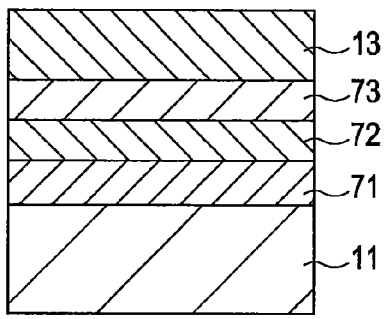
FIGS. 4A to 4F are cross-sectional views showing production steps of the first embodiment (second example of a method for making a solid-state imaging device)

As shown in FIG. 4A, a bulk silicon substrate is used as a first substrate 11, for example. Alternatively, an epitaxially grown substrate including a silicon substrate and epitaxially grown silicon layers thereon can be used naturally.

Next, a first impurity-doped layer 71 is formed on the first substrate 11, a buffer layer 72, i.e., an undoped layer, is formed on the first impurity-doped layer 71, and a second impurity-doped layer 73 having a lower dopant concentration than the first impurity-doped layer 71 is formed on the buffer layer 72.

The first impurity-doped layer 71 is, for example, a semiconductor layer doped with a P-type impurity. For example, the first impurity-doped layer 71 is an epitaxially grown layer doped with boron (B) and has a boron concentration which enables detection of the end point of silicon polishing. The boron concentration is set in the range of $1\times10^{19}$ atoms/cm$^3$ to $5\times10^{19}$ atoms/cm$^3$ from the viewpoint of process selectivity. The thickness is preferably 1 μm or more and 3 μm or less. A sufficient process selectivity for silicon can be obtained in the above-described concentration range. Moreover, the first impurity-doped layer 71 can serve as a stopper during silicon processing when the first impurity-doped layer 71 has the above-described thickness. Note that the upper limit for the thickness of the first impurity-doped layer 71 is set to 3 μm since the stopper function does not improve beyond 3 μm.

The buffer layer 72 is, for example, an undoped epitaxially grown layer. The thickness of the buffer layer 72 is preferably 3 μm or less. Note that the upper limit for the thickness of the buffer layer 72 is set to 3 μm since the stopper function does not improve beyond 3 μm.

The second impurity-doped layer 73 is a boron-doped epitaxially grown layer having a lower dopant concentration than the first impurity-doped layer 71. To prevent impact ionization described above, the boron (B) concentration in the second impurity-doped layer 73 is preferably $1\times10^{17}$ atoms/cm$^3$ to $1\times10^{18}$ atoms/cm$^3$ and the thickness is preferably 100 nm to 500 nm. When the concentration is lower than the above concentration range, the pinning effect may be insufficient. When the concentration is beyond the above range, avalanche phenomena caused by impact ionization may occur.

Next, one example of specific conditions for epitaxially growing the first impurity-doped layer 71, the buffer layer 72, and the second impurity-doped layer 73 is described.

The system used for the epitaxial growth is, for example, a 200-mm single-wafer epitaxial CVD system having a chamber capacity of, for example, 5 to 20 L.

The epitaxial growth conditions for the first impurity-doped layer 71 are a pressure of 1.33 kPa or more and 101.3 kPa or less and a growth temperature of 1000° C. or more and 1150° C. or less. Dichlorosilane ($SiH_2Cl_2$), diborane ($B_2H_6$ (diluted to 5% with $H_2$)), and hydrogen ($H_2$) are used as process gasses. The flow rates are, for example, 500 cm$^3$/min or more and 2000 cm$^3$/min or less for $SiH_2Cl_2$, 1 cm$^3$/min or more and 10 cm$^3$/min or less for $B_2H_6$ (diluted to 5% with $H_2$), and 10 L/min or more and 30 L/min or less for $H_2$.

The epitaxial growth conditions for the buffer layer 72 are a pressure of 1.33 kPa or more and 101.3 kPa or less and a growth temperature of 1000° C. or more and 1150° C. or less. Dichlorosilane ($SiH_2Cl_2$) and hydrogen ($H_2$) are used as process gasses. The flow rates are, for example, 500 cm$^3$/min or more and 2000 cm$^3$/min or less for $SiH_2Cl_2$, and 10 L/min or more and 30 L/min or less for $H_2$.

The epitaxial growth conditions for the second impurity-doped layer 73 are a pressure of 1.33 kPa or more and 101.3 kPa or less and a growth temperature of 1000° C. or more and 1150° C. or less. Dichlorosilane ($SiH_2Cl_2$), diborane ($B_2H_6$ (diluted to 5% with $H_2$)), and hydrogen ($H_2$) are used as process gasses. The flow rates are, for example, 500 cm$^3$/min or more and 2000 cm$^3$/min or less for $SiH_2Cl_2$, 0.01 cm$^3$/min or more and 0.1 cm$^3$/min or less for $B_2H_6$ (diluted to 5% with $H_2$), and 10 L/min or more and 30 L/min or less for $H_2$.

Instead of $SiH_2Cl_2$ mentioned above, $SiH_4$, $SiHCl_3$, or $SiCl_4$ may be used as a silicon (Si) precursor gas. The process gas flow ratios are adjusted in the above ranges on the basis of the capacity ratio so that a 200 mm single-wafer-type epitaxial CVD system and a 300-mm single-wafer-type or batch-type epitaxial CVD system can be used for production.

Next, a semiconductor layer 13 is formed on the second impurity-doped layer 73. The semiconductor layer 13 is a semiconductor layer formed by epitaxial growth. The semiconductor layer 13 is, for example, an epitaxially grown silicon layer.

An example of conditions for forming an epitaxially grown silicon layer as the semiconductor layer 13 by using a single-wafer epitaxial CVD system for 200 mm wafers will now be described.

For example, monosilane ($SiH_4$) and hydrogen ($H_2$) were used as the source gasses for epitaxial growth. The supply flow rate of monosilane was 50 cm$^3$/min to 500 cm$^3$/min, for example. The supply flow rate of hydrogen was 10 L/min to 30 L/min, for example. The pressure of the epitaxial growth atmosphere was set to, for example, 1.33 kPa, and the epitaxial growth temperature was set to, for example, 750° C.

In the example of forming the first impurity-doped layer 71, the buffer layer 72, the second impurity-doped layer 73, and the semiconductor layer 13, the following epitaxial CVD systems may be used instead of the single-wafer epitaxial CVD system for 200 mm wafers. Examples of the systems include a single-wafer epitaxial CVD system for 300 mm wafers, a batch-type epitaxial CVD system for 200 mm wafers, and a batch-type epitaxial CVD system for 300 mm wafers. In sum, an epitaxial CVD system can be used regardless of wafer diameter or whether it is a single-wafer-type or a batch-type. The epitaxial CVD system can form films by changing the process gas flow rates described above on the basis of the chamber capacity (e.g., in proportion to the chamber capacity). The dopant concentration of the second impurity-doped layer 73 that serves as a pinning layer is preferably, for example, $1\times10^{16}$ atoms/cm$^3$ at the interface after the subsequent heating step. At such a concentration, charges produced by photoelectric conversion of blue wavelength light in particular can be effectively accumulated.

Figure 4D:
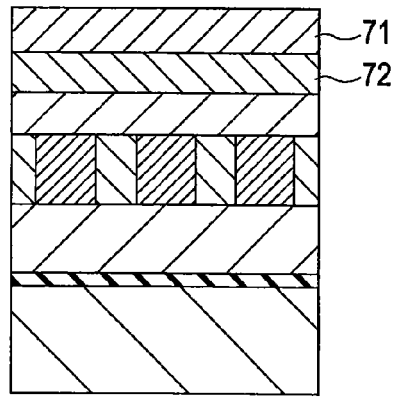
Figure 4B:
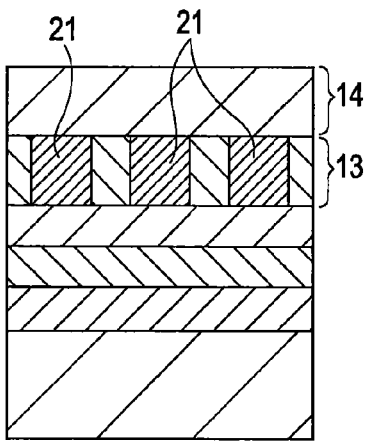

As shown in FIG. 4B, photoelectric conversion units 21 that convert incident light into an electric signal is formed in the semiconductor layer 13.

Although not shown in the drawing, transistors for pixel units in which the photoelectric conversion units 21 are formed, transistors for a peripheral circuit unit disposed in the periphery of the pixel units, and other associated components are also formed in the semiconductor layer 13.

A wiring section 14 is formed on the semiconductor layer 13. Although the details of the wiring section 14 are not illustrated, for example, wiring layers each including a plurality of wirings are stacked with interlayer insulation films therebetween and plugs in contact holes are used to connect the wirings between the wiring layers. The interlayer insulating films are composed of silicon oxide. The upper-most interlayer insulating film preferably has a flat surface.

Figure 4E:
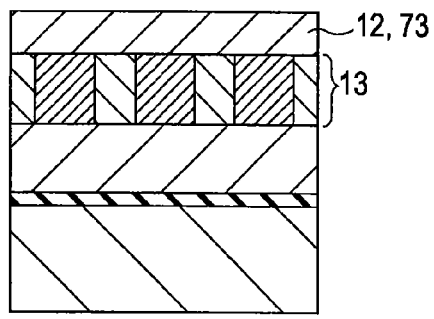
Figure 4C:
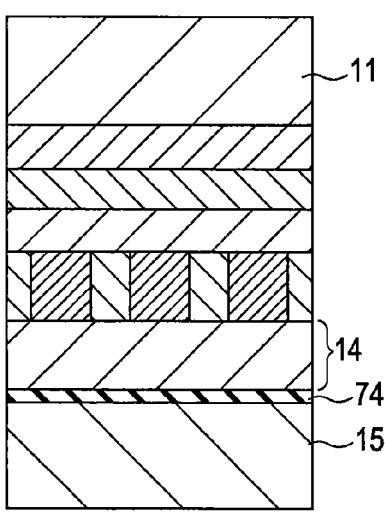

Next, as shown in FIG. 4C, the positions of the first substrate 11 and the wiring section 14 are flipped, and a second substrate 15 is bonded on the wiring section 14. The uppermost surface of the wiring section 14 serves as the flat interlayer insulating film.

If the surface of the interlayer insulating film is not flat, as shown in FIG. 4C, an interlayer insulating film 74 composed of, for example, silicon oxide is formed on the surface of the wiring section 14 to make a flat surface. The surface of the interlayer insulating film 74 is bonded to the surface of the second substrate 15, which is a silicon substrate.

Next, as shown in FIG. 4D, the first substrate 11 (refer to FIGS. 4A and 4C, etc.) is removed to expose the first impurity-doped layer 71. The first substrate 11 is removed by, for example, grinding. The first substrate 11 is removed by grinding the back surface. After most of the first substrate 11 is removed by grinding, the remaining the first substrate 11 is removed by polishing, etching, or both. For example, etching of silicon (Si) is conducted with ammonia water and stopped at the surface of the first impurity-doped layer 71. Similarly, when polishing (e.g., chemical mechanical polishing) is employed, polishing can be stopped at the surface of the first impurity-doped layer 71. Thus, the first impurity-doped layer 71 can absorb any variation that occurs in removing the first substrate 11. The remaining first impurity-doped layer 71 is then selectively etched away with a mixed solution of fluoronitric acid and acetic acid. The buffer layer 72 exposed thereby is removed by finishing polishing by, for example, chemical mechanical polishing. In the drawing, the state immediately before removal of the buffer layer 72 is shown.

As a result, as shown in FIG. 4E, the second impurity-doped layer 73 that serves as the pinning layer 12 remains exposed. By the method described above, silicon of the first substrate 11 can be selectively removed by using the first impurity-doped layer 71 as a stopper. In addition, the second impurity-doped layer 73 that has an impurity concentration optimum for pinning can be formed as the pinning layer 12. An inexpensive bulk silicon substrate can be used as the first substrate 11. Since the pinning layer 12 can have a steep concentration profile at an appropriate concentration, dark current can be effectively suppressed and the degradation of sensitivity can be reduced. Moreover, the step of implanting boron (B) ions which has been conducted in the related art can be omitted. When the first impurity-doped layer 71 contains germanium or carbon, the function of the first impurity-doped layer 71 as a stopper layer can be further enhanced during the step of removing the first substrate 11.

Figure 4F:
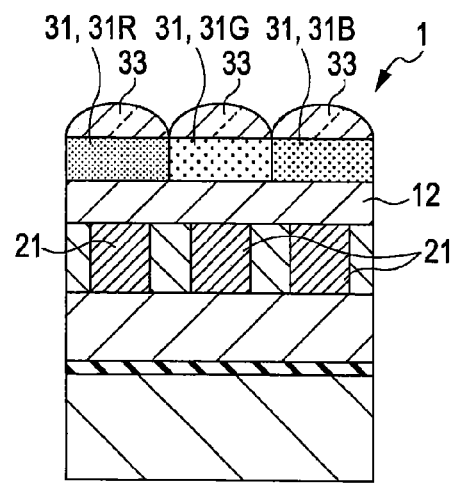

Next, as shown in FIG. 4F, color filter layers 31 (31R, 31G, and 31B) are formed on the pinning layer 12. In general, the color filter layers 31 of three colors, namely, red (red), green (G), and blue (B) are formed to obtain color images. Naturally, other color filter layers of complementary colors can be used. Condenser lenses 33 that guide incident light into the photoelectric conversion units 21 are formed on the color filter layers 31. This ends the fabrication of a back-illuminated solid-state imaging device 1.

1.3. Third Example of a Method for Making a Solid-State Imaging Device

A third example of a method for making a solid-state imaging device of the first embodiment will now be described with reference to cross-sectional views of FIGS. 5A to 5F showing production steps. The cross-sectional views of FIGS. 5A to 5F each schematically show a relevant part for the method for making a solid-state imaging device. The solid-state imaging device described here is a back-illuminated solid-state imaging device.

Figure 5A:
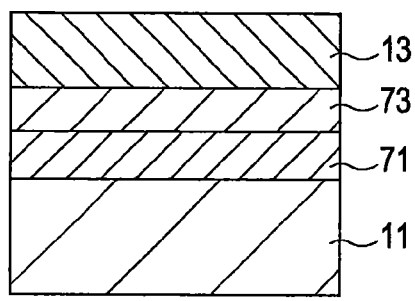
FIGS. 5A to 5F are cross-sectional views showing production steps of the first embodiment (third example of a method for making a solid-state imaging device)

As shown in FIG. 5A, a bulk silicon substrate is used as a first substrate 11, for example. Alternatively, an epitaxially grown substrate including a silicon substrate and epitaxially grown silicon layers thereon can be used naturally.

Next, a first impurity-doped layer 71 is formed on the first substrate 11, a buffer layer 72, and a second impurity-doped layer 73 having a lower dopant concentration than the first impurity-doped layer 71 is formed on the first impurity-doped layer 71.

The first impurity-doped layer 71 is, for example, a semiconductor layer doped with a P-type impurity. For example, the first impurity-doped layer 71 is an epitaxially grown layer doped with boron (B) and has a boron concentration which enables detection of the end point of silicon polishing. The boron concentration is set in the range of $1 \times 10^{19}$ atoms/cm$^3$ to $5 \times 10^{19}$ atoms/cm$^3$ from the viewpoint of process selectivity. The thickness is preferably 1 μm or more and 3 μm or less. A sufficient process selectivity for silicon can be obtained in the above-described concentration range. Moreover, the first impurity-doped layer 71 can serve as a stopper during silicon processing when the first impurity-doped layer 71 has the above-described thickness. Note that the upper limit for the thickness of the buffer layer 72 is set to 3 μm since the stopper function does not improve beyond 3 μm.

The second impurity-doped layer 73 is a boron-doped epitaxially grown layer having a lower dopant concentration than the first impurity-doped layer 71. To prevent impact ionization described above, the boron (B) concentration in the second impurity-doped layer 73 is preferably $1 \times 10^{17}$ atoms/cm$^3$ to $1 \times 10^{18}$ atoms/cm$^3$ and the thickness is preferably 100 nm to 500 nm. When the concentration is lower than the above concentration range, the pinning effect may be insufficient. When the concentration is beyond the above range, avalanche phenomena caused by impact ionization may occur.

The example of specific conditions for epitaxially growing the first impurity-doped layer 71 and the second impurity-doped layer 73 are the same as in the second example described above.

Next, a semiconductor layer 13 is formed on the second impurity-doped layer 73. The semiconductor layer 13 is a semiconductor layer formed by epitaxial growth. The semiconductor layer 13 is, for example, an epitaxially grown silicon layer. The epitaxy conditions are the same as in the second example described above.

Figure 5D:
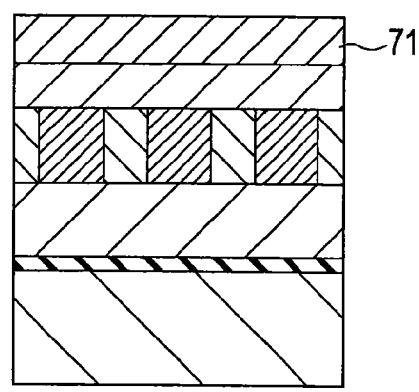
Figure 5B:
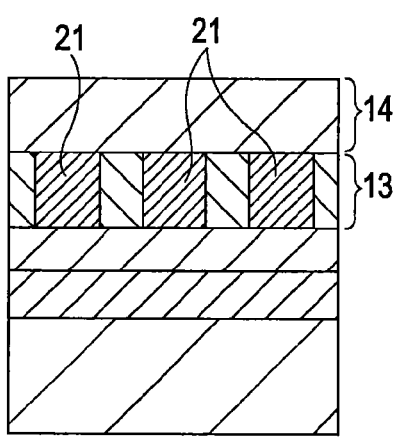

As shown in FIG. 5B, photoelectric conversion units 21 that convert incident light into an electric signal is formed in the semiconductor layer 13.

Although not shown in the drawing, transistors for pixel units in which the photoelectric conversion units 21 are formed, transistors for a peripheral circuit unit disposed in the periphery of the pixel units, and other associated components are also formed in the semiconductor layer 13.

A wiring section 14 is formed on the semiconductor layer 13. Although the details of the wiring section 14 are not illustrated, for example, wiring layers each including a plurality of wirings are stacked with interlayer insulation films therebetween and plugs in contact holes are used to connect the wirings between the wiring layers. The interlayer insulating films are composed of silicon oxide. The upper-most interlayer insulating film preferably has a flat surface.

Figure 5E:
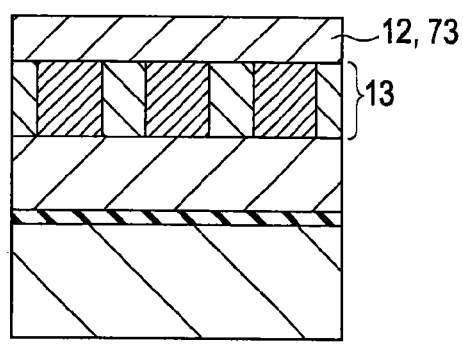
Figure 5C:
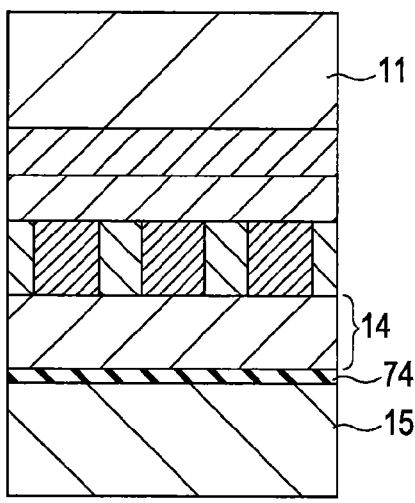

Next, as shown in FIG. 5C, the positions of the first substrate 11 and the wiring section 14 are flipped, and a second substrate 15 is bonded on the wiring section 14. The upper-most surface of the wiring section 14 serves as the flat interlayer insulating film. If the surface of the interlayer insulating film is not flat, as shown in FIG. 5C, an interlayer insulating film 74 composed of, for example, silicon oxide is formed on the surface of the wiring section 14 to make a flat surface. The surface of the interlayer insulating film 74 is bonded to the surface of the second substrate 15, which is a silicon substrate.

Next, as shown in FIG. 5D, the first substrate 11 (refer to FIGS. 5A and 5C, etc.) is removed to expose the first impurity-doped layer 71. The first substrate 11 is removed by, for example, grinding. The first substrate 11 is removed by grinding the back surface. After most of the first substrate 11 is removed by grinding, the remaining the first substrate 11 is removed by polishing, etching, or both. For example, etching of silicon (Si) is conducted with ammonia water and stopped at the surface of the first impurity-doped layer 71. Similarly, when polishing (e.g., chemical mechanical polishing) is employed, polishing can be stopped at the surface of the first impurity-doped layer 71. Thus, the first impurity-doped layer 71 can absorb any variation that occurs in removing the first substrate 11. The remaining first impurity-doped layer 71 is removed by finish polishing by, e.g., chemical mechanical polishing. In such a case, the selective removal of the first impurity-doped layer 71 is not performed. Thus, the thickness control for the finish polishing should be accurately implemented so as not to leave any first impurity-doped layer 71.

As a result, as shown in FIG. 5E, the second impurity-doped layer 73 that serves as the pinning layer 12 remains exposed. By the method described above, silicon of the first substrate 11 can be selectively removed by using the first impurity-doped layer 71 as a stopper. In addition, the second impurity-doped layer 73 that has an impurity concentration optimum for pinning can be formed as the pinning layer 12. An inexpensive bulk silicon substrate can be used as the first substrate 11. Since the pinning layer 12 can have a steep concentration profile at an appropriate concentration, dark current can be effectively suppressed and the degradation of sensitivity can be reduced. Moreover, the step of implanting boron (B) ions which has been conducted in the related art can be omitted. When the first impurity-doped layer 71 contains germanium or carbon, the function of the first impurity-doped layer 71 as a stopper layer can be further enhanced during the step of removing the first substrate 11.

Figure 5F:
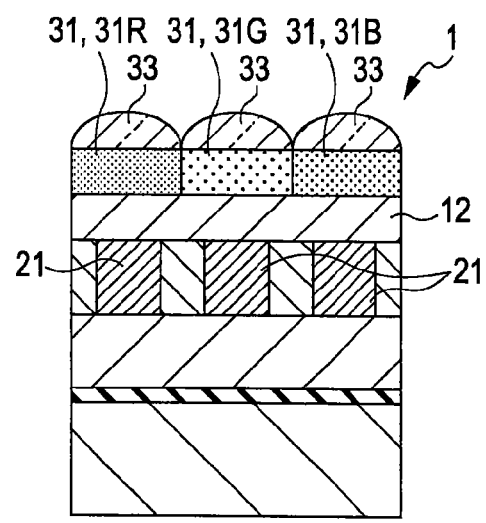

Next, as shown in FIG. 5F, color filter layers 31 (31R, 31G, and 31B) are formed on the pinning layer 12. In general, the color filter layers 31 of three colors, namely, red (red), green (G), and blue (B) are formed to obtain color images. Naturally, other color filter layers of complementary colors can be used. Condenser lenses 33 that guide incident light into the photoelectric conversion units 21 are formed on the color filter layers 31. This ends the fabrication of a back-illuminated solid-state imaging device 1.

2. Second Embodiment

[Structural Example of a Solid-State Imaging Device]

Figure 6:
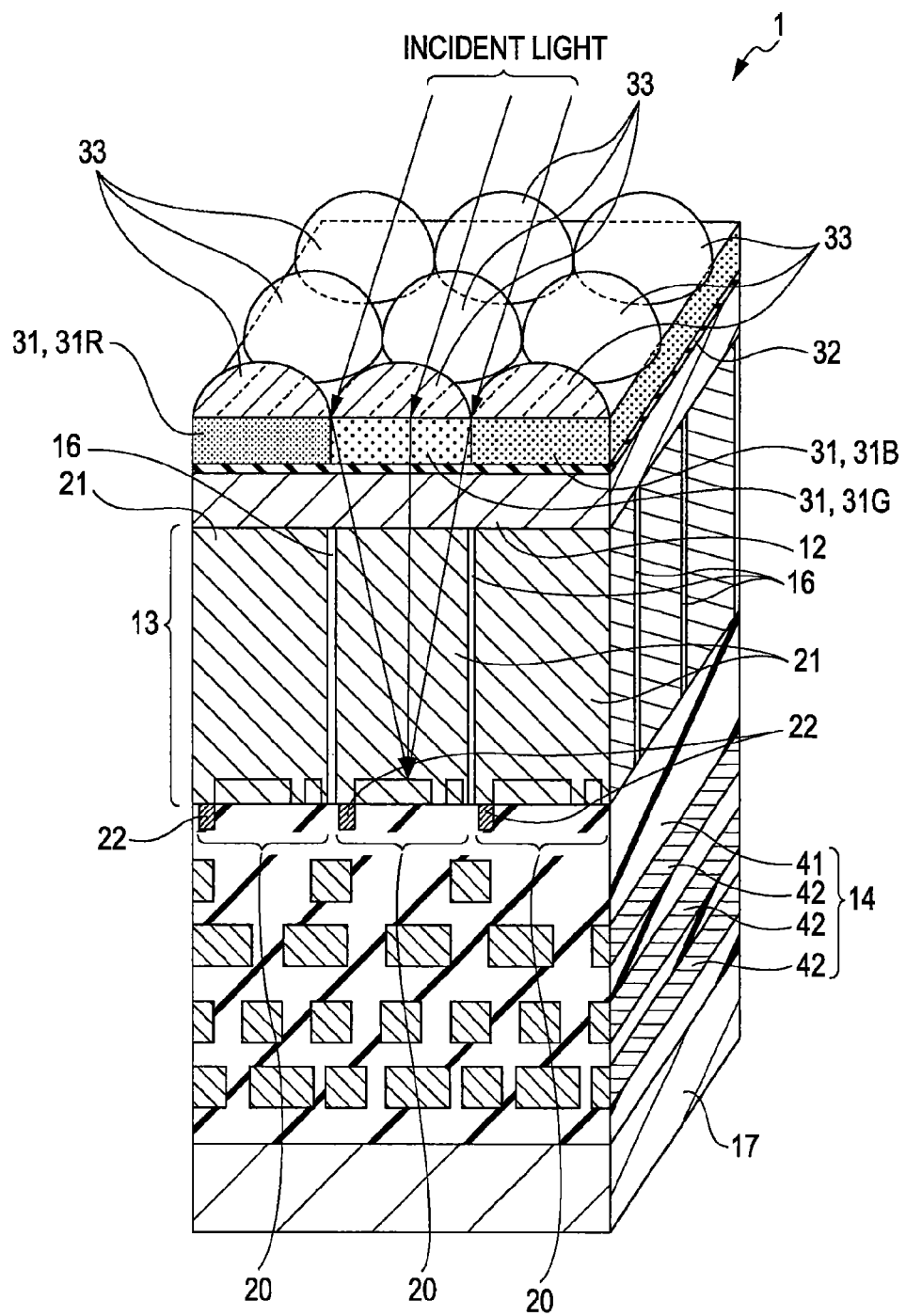
FIG. 6 is a schematic oblique cross-sectional view showing a second embodiment (one structural example of a solid-state imaging device)

A structural example of a solid-state imaging device of a second embodiment will now be described with reference to a schematic oblique cross-sectional view of FIG. 6. FIG. 6 is a drawing schematically showing a relevant portion of the solid-state imaging device. The solid-state imaging device described here is a back-illuminated solid-state imaging device.

As shown in FIG. 6, a solid-state imaging device 1 has a semiconductor layer 13. The semiconductor layer 13 is, for example, an epitaxially grown silicon layer. The semiconductor layer 13 has therein photoelectric conversion units (e.g., photodiodes) 21 that convert incident light into electric signals. In-pixel transistor groups 22 (part of which is shown in the drawing) including transfer transistors, reset transistors, amplifying transistors, selection transistors, and the like are also formed in the semiconductor layer 13. The photoelectric conversion unit 21 and the in-pixel transistor group 22 constitute a pixel 20. A plurality of such pixels 20 are arranged in a plurality of rows and a plurality of columns to form a pixel region. Although not shown in the drawing, a peripheral circuit unit for processing signal charges read out from the photoelectric conversion units 21 are formed. The peripheral circuit unit include, for example, driving circuits for driving respective pixels 20, a vertical scanning circuit for pixels, a timing generator, and a horizontal scanning circuit.

Element isolation regions 16 are formed in a part of the periphery of the pixels 20, e.g., between the pixels 20 in a row or column direction.

A wiring section 14 is formed on a surface of the semiconductor layer 13 (the lower surface of the semiconductor layer 13 in the drawing) in which the photoelectric conversion units 21 are formed. The wiring section 14 includes wirings 42 and insulating films 41 that coat the wirings 42. The wiring section 14 is disposed on a support substrate 17 (equivalent to the second substrate 15 of the first embodiment). The support substrate 17 is, for example, a silicon substrate.

The solid-state imaging device 1 has a pinning layer 12 formed on the back surface of the semiconductor layer 13. A photodiode which forms a part of the photoelectric conversion unit 21 described above has a P-type hole accumulation layer at the light incident side and an N-type signal charge accumulation layer in the depth direction joined to the P-type layer. When such a photoelectric conversion unit that uses electrons as carriers is to be formed, the pinning layer 12 is doped with a P-type impurity. In contrast, when the photodiode which forms a part of the photoelectric conversion unit is to be formed is designed to use holes of an opposite conductivity type as carriers, the pinning layer 12 is doped with an N-type impurity. The P-type impurity is, for example, boron, and the N-type impurity is, for example, phosphorus or arsenic.

The impurity concentration in the pinning layer 12 is, for example, on the order of $10^{19}$ atoms/cm$^3$. For example, the impurity concentration may be $3 \times 10^{19}$ atoms/cm$^3$. At such a concentration, diffusion of the impurity in the pinning layer 12 can be suppressed. The pinning layer 12 is formed to have a thickness of, for example, 400 nm.

Color filter layers 31 are formed on the pinning layer 12 (upper side in the drawing) with a light-transmitting insulating film 32 therebetween. In general, color filter layers 31R, 31G, and 31B of three colors, namely, red (R), green (G), and blue (B), are formed to obtain color images. Naturally, color filter layers of other colors and/or complementary colors can also be used. Condenser lenses 33 that guide incident light into the photoelectric conversion units 21 are formed on the color filter layers 31.

Next, one example of application of the solid-state imaging device 1 is described with reference to the block diagram of FIG. 7. The solid-state imaging device 1 may be applied to, for example, video cameras, digital still cameras, and cellular phone cameras.

Figure 7:
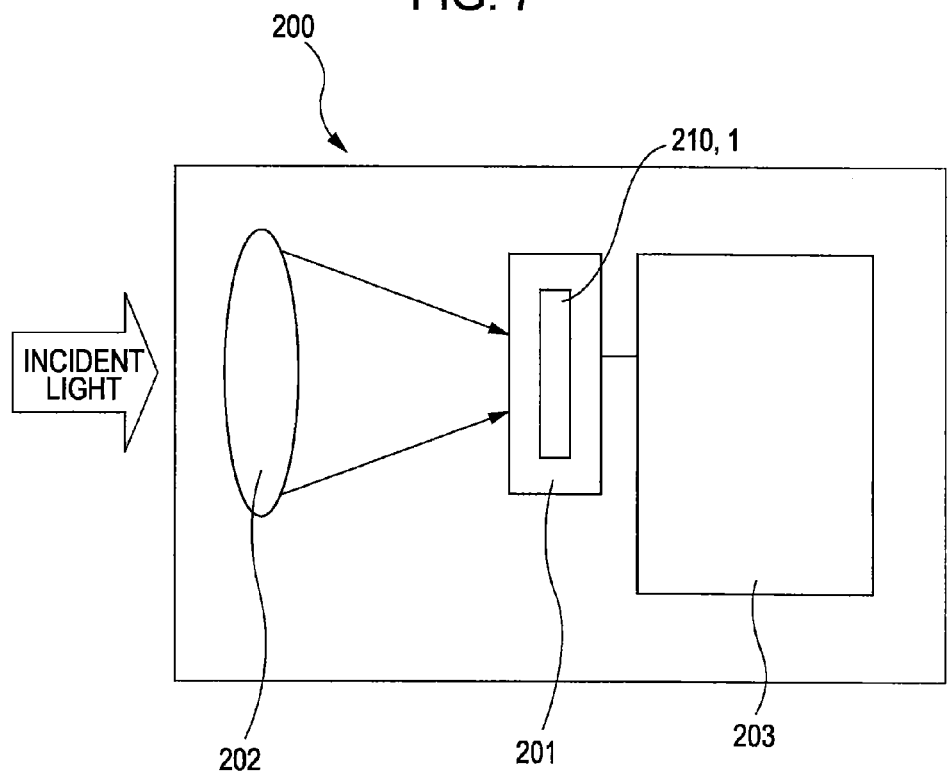
FIG. 7 is a block diagram showing one example of an imaging apparatus to which a solid-state imaging device of an embodiment is applied.

As shown in FIG. 7, an imaging apparatus 200 includes an imaging unit 201 that includes a solid-state imaging device 210. An image-forming optical unit 202 configured to form images is disposed at the light-condensing side of the imaging unit 201. A signal processor 203 that includes a driving circuit for driving the imaging unit 201, a signal processor circuit for processing photoelectrically converted signals from the solid-state imaging device 210, and other associated components is connected to the imaging unit 201. The image signal processed in the signal processor 203 can be stored in an image storage (not shown). The solid-state imaging device 1 described in the first embodiment can be used as the solid-state imaging device 210 in the imaging apparatus 200.

Since the inexpensive solid-state imaging device 1 is used as the solid-state imaging device 210 of the imaging apparatus 200, the cost can be reduced as described above. Since a solid-state imaging device that can suppress occurrence of dark current is used, the sensitivity is improved and high-quality images can be recorded.

The structure of the imaging apparatus 200 is not limited to one described above. The imaging apparatus 200 can be any imaging apparatus that uses a solid-state imaging device.

The imaging apparatus 200 may be designed as a one-chip or as a module having an imaging function in which an imaging unit, a signal processor, and an optical system are packaged together.

Examples of the imaging apparatus include cameras and portable apparatuses having imaging functions. Moreover, "imaging" not only includes capturing of images for normal shooting with cameras but has a broad meaning that includes fingerprint detection and the like.

3. Third Embodiment

[Structural Example of a Solid-State Imaging Device]

Figure 8:
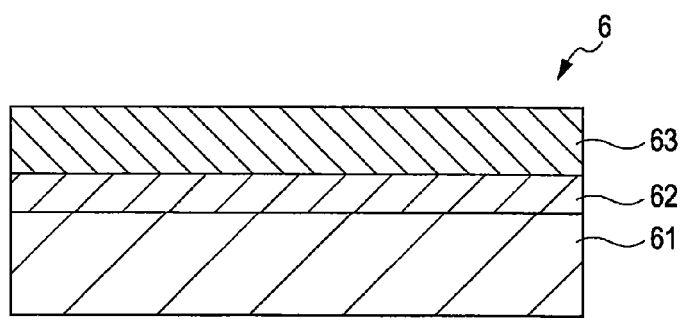
FIG. 8 is a schematic structural cross-sectional view showing a third embodiment (one structural example of a manufacturing substrate for a solid-state imaging device)
Figure 9A:
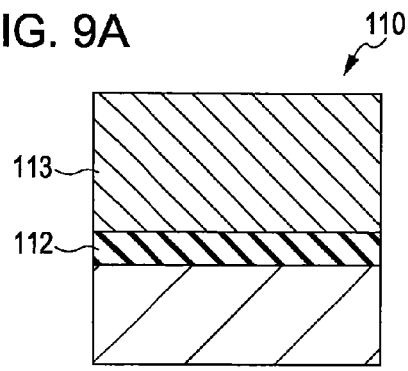
FIGS. 9A to 9F are cross-sectional views showing production steps of an example of a method for making a solid-state imaging device of related art.
Figure 9B:
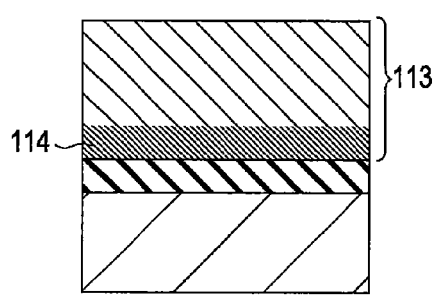
Figure 9C:
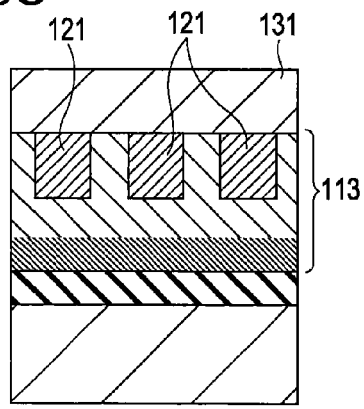
Figure 9D:
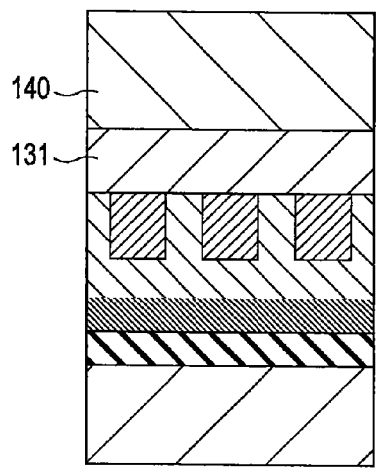
Figure 9E:
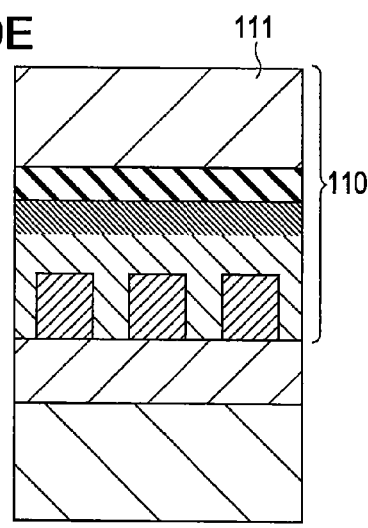
Figure 9F:
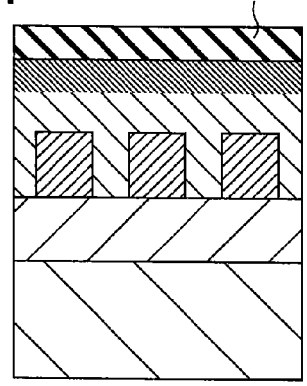
Figure 10A:
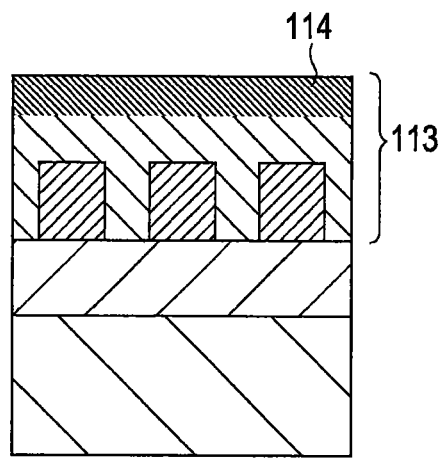
FIGS. 10A and 10B are cross-sectional views showing production steps of an example of a method for making a solid-state imaging device of related art.
Figure 10B:
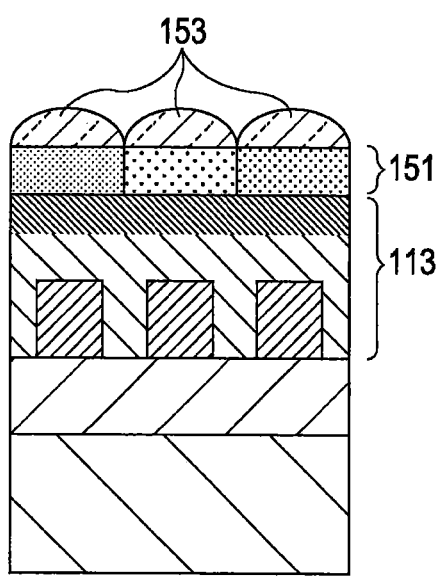

A structural example of a manufacturing substrate for a solid-state imaging device according to a third embodiment will now be described with reference to a schematic structural cross-sectional view of FIG. 8. FIG. 8 shows a manufacturing substrate suitable as a substitute for a SOI manufacturing substrate for a solid-state imaging device that has been used in the related art.

As shown in FIG. 8, for example, a bulk silicon substrate is used as a substrate 61 (equivalent to the first substrate 11 of the first embodiment). Alternatively, an epitaxially grown substrate including a silicon substrate and epitaxially grown silicon layers thereon can be used naturally.

A pinning layer 62 (equivalent to the pinning layer 12 of the first embodiment), which is a P- or N-type semiconductor layer formed by deposition, is formed on the substrate 61. The P- or N-type semiconductor layer is a semiconductor layer doped with a P-type impurity or an N-type impurity and is formed as an impurity-doped epitaxially grown layer formed by epitaxial growth, for example. The P- or N-type semiconductor layer epitaxially grown on the substrate 61 has a thickness equal to or less than the critical thickness and lattice-matches the substrate 61. The P- or N-type semiconductor layer having a thickness equal to or less than the critical thickness and lattice-matching the substrate 61 is either P-type silicon or N-type silicon.

The P-type impurity is, for example, boron, and the N-type impurity is, for example, phosphorus, arsenic, or antimony.

The impurity concentration in the pinning layer 62 is, for example, on the order of $10^{19}$ atoms/cm$^3$. For example, the impurity concentration may be $3\times10^{19}$ atoms/cm$^3$. At such a concentration, diffusion of the impurity in the pinning layer 62 can be suppressed even when a heating step is performed. The pinning layer 62 is formed to have a thickness of, for example, 400 nm.

The pinning layer 62 may be formed by the same method as in the first embodiment.

The P- or N-type semiconductor layer having a thickness equal to or less than the critical film thickness and lattice-matching the substrate 61 may be formed with a chalcopyrite compound semiconductor composed of a P-type CuGaInS mixed crystal or an N-type CuGaInS mixed crystal. A P-type CuAlGaInS mixed crystal, an N-type CuAlGaInS mixed crystal, a P-type CuAlGaInSSe mixed crystal, an N-type CuAlGaInSSe mixed crystal, and the like may also be used in the P- or N-type semiconductor layer described above. For example, when the substrate 61 is a silicon substrate, $CuGa_{0.52}In_{0.48}S_2$, $CuAl_{0.24}Ga_{0.23}In_{0.53}S_2$, $CuAl_{0.36}Ga_{0.64}S_{1.28}Se_{0.72}$, and the like lattice-match the substrate 61. When the substrate 61 is a GaAs substrate, for example, $Ga_{0.52}In_{0.48}P$, $Al_{0.53}In_{0.47}P$, and the like lattice-match the substrate 61, and these may be used to form the P- or N-type semiconductor layer. When the substrate 61 is an InP substrate, for example, $Ga_{0.47}In_{0.53}As$, $Al_{0.47}In_{0.53}As$, and the like lattice-match the substrate 61, and these may be used to form the P- or N-type semiconductor layer.

The P- or N-type semiconductor layer epitaxially grown on the substrate 61 may be a layer in which the lattice constant is gradually changed on the substrate 61. The P- or N-type semiconductor layer having the lattice constant gradually changed on the substrate 61 may be formed with P-type SiGeC or N-type SiGeC. The P-type impurity is, for example, boron, and the N-type impurity is, for example, phosphorus, arsenic, or antimony.

The P- or N-type semiconductor layer having the lattice constant gradually changed on the substrate 61 may be formed with a chalcopyrite compound semiconductor composed of a P-type CuGaInS mixed crystal or an N-type CuGaInS mixed crystal.

For example, a silicon layer doped with one or both of germanium and carbon is used as the pinning layer 62. When the pinning layer 62 contains germanium or carbon, the function of the pinning layer 62 as a stopper layer can be further enhanced during the step of removing the substrate 61.

For example, when the pinning layer 62 is doped with carbon (C), silicon carbide is formed and polishing or etching easily stops at the pinning layer 62 surface due to the presence of silicon carbide. The same occurs when the pinning layer 62 is doped with germanium. That is, silicon germanium is formed which causes polishing or etching to easily stop at the pinning layer 62 surface. In other words, the pinning layer 62 can be prevented from being polished or etched during the process of removing the substrate 61 by polishing or etching.

An example of forming the pinning layer 62 with silicon germanium doped with a P-type impurity, boron, is the same as that described in the first embodiment.

An example of forming the pinning layer 62 with silicon carbide doped with a P-type impurity, boron, is the same as that described in the first embodiment.

A semiconductor layer 63 (equivalent to the semiconductor layer 13 of the first embodiment) is formed on the pinning layer 62. The semiconductor layer 63 is, for example, an epitaxially grown silicon layer. An example of forming the epitaxially grown silicon layer is the same as that described in the first embodiment. A manufacturing substrate 6 of the solid-state imaging device is formed as such.

In making a back-illuminated CMOS sensor using the manufacturing substrate 6 of the solid-state imaging device having the above-described structure, the impurity used as a dopant for the pinning layer 62 is selected as follows.

A photodiode which forms a part of a photoelectric conversion unit of a back-illuminated CMOS sensor has a P-type hole accumulation layer and an N-type signal charge accumulation layer in the depth direction joined to the P-type layer. When such a photoelectric conversion unit that uses electrons as carriers is to be formed, the pinning layer 62 is doped with a P-type impurity. Alternatively, the photodiode which forms a part of the photoelectric conversion unit may be designed to use holes as carriers. According to this design, the conductivity type of the photoelectric conversion unit is reversed from that described above, and thus the pinning layer 62 is doped with an N-type impurity.

Since a bulk silicon substrate less expensive than a SOI substrate is used as the substrate 61 of the manufacturing substrate 6, a low-cost manufacturing substrate can be provided. Since the pinning layer 62 is a P- or N-type semiconductor layer formed by deposition, the impurity concentration distribution of the pinning layer 62 in the depth direction has a steep concentration gradient. Thus, a solid-state imaging device made using this manufacturing substrate 6 can achieve cost reduction since a less expensive manufacturing substrate is used. In addition, dark current can be sufficiently suppressed.

The present application contains subject matter related to that disclosed in Japanese Priority Patent Application JP 2008-231779 filed in the Japan Patent Office on Sep. 10, 2008 and Japanese Priority Patent Application JP 2009-163729 filed in the Japan Patent Office on Jul. 10, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor layer formed on a pinning layer, the semiconductor layer including a pixel unit and a peripheral circuit unit formed in a periphery of the pixel unit, the pixel unit having a photoelectric conversion unit configured to convert incident light into an electric signal; and
a wiring section disposed between the semiconductor layer and a support substrate,
wherein the pinning layer is a P-type semiconductor layer or an N-type semiconductor layer formed by deposition,
the P-type semiconductor layer or the N-type semiconductor layer is a lager epitaxially grown on an other substrate, and
the P-type semiconductor layer or the N-type semiconductor layer have a thickness equal to or less than the critical thickness and lattice-matches the other substrate.

2. The solid-state imaging device according to claim 1, wherein the P-type semiconductor layer or the N-type semiconductor layer is P-type silicon or N-type silicon.

3. The solid-state imaging device according to claim 2, wherein a P-type impurity is boron and an N-type impurity is phosphorus, arsenic, or antimony.

4. The solid-state imaging device according to claim 2, wherein the P-type semiconductor layer or the N-type semiconductor layer contains germanium or carbon.

5. The solid-state imaging device according to claim 1, wherein the P-semiconductor layer or N-type semiconductor layer is formed with a chalcopyrite compound semiconductor composed of a P-type CuGaInS mixed crystal or an N-type CuGaInS mixed crystal.

6. The solid-state imaging device according to claim 1, wherein the P-semiconductor layer or N-type semiconductor layer is formed of a compound semiconductor including P-type SiGeC or N-type SiGeC.

7. The solid-state imaging device according to claim 1, wherein the support substrate is bonded on the wiring section.

8. The solid-state imaging device according to claim 1, wherein the other substrate has been removed by grinding, polishing, or etching.

9. The solid-state imaging device according to claim 1, wherein the semiconductor layer is configured to receive the incident light through the pinning layer.

10. The solid-state imaging device according to claim 1, further comprising a color filter formed on a side of the pinning layer opposite from the semiconductor layer.

11. The solid-state imaging device according to claim 10, further comprising a condenser lens formed on a side of the color filter opposite from the pinning layer.

12. The solid-state imaging device according to claim 11, wherein the other substrate has been removed by grinding, polishing, or etching.

* * * * *